US010686128B2

(12) United States Patent
El-Hinnawy et al.

(10) Patent No.: US 10,686,128 B2
(45) Date of Patent: *Jun. 16, 2020

(54) SEMICONDUCTOR DEVICES HAVING PHASE-CHANGE MATERIAL (PCM) RADIO FREQUENCY (RF) SWITCHES AND INTEGRATED PASSIVE DEVICES

(71) Applicant: Newport Fab, LLC, Newport Beach, CA (US)

(72) Inventors: Nabil El-Hinnawy, Irvine, CA (US); Gregory P. Slovin, Irvine, CA (US); Jefferson E. Rose, Hawthorne, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/274,998

(22) Filed: Feb. 13, 2019

(65) Prior Publication Data

US 2020/0058851 A1 Feb. 20, 2020

Related U.S. Application Data

(63) Continuation-in-part of application No. 16/161,960, filed on Oct. 16, 2018, and a continuation-in-part of
(Continued)

(51) Int. Cl.
*H01L 45/00* (2006.01)
*H01L 23/48* (2006.01)
(Continued)

(52) U.S. Cl.
CPC ............ *H01L 45/06* (2013.01); *H01L 23/481* (2013.01); *H01L 23/5223* (2013.01);
(Continued)

(58) Field of Classification Search
None
See application file for complete search history.

(56) References Cited

U.S. PATENT DOCUMENTS 5,976,932 A 11/1999 Kerber
6,448,576 B1 9/2002 Davis
(Continued)

FOREIGN PATENT DOCUMENTS

WO WO 2016/028362 2/2016

OTHER PUBLICATIONS

G. Slovin, et al. "AlN Barriers for Capacitance Reduction in Phase-Change RF Switches," in *IEEE Electron Device Letters*, vol. 37, No. 5, pp. 568-571, May 2016.
(Continued)

*Primary Examiner* — J. E. Schoenholtz
(74) *Attorney, Agent, or Firm* — Farjami & Farjami LLP

(57) ABSTRACT

A semiconductor device includes a substrate and a phase-change material (PCM) radio frequency (RF) switch, having a heating element, a PCM situated over the heating element, and PCM contacts situated over passive segments of the PCM. The heating element extends transverse to the PCM and underlies an active segment of the PCM. In one approach, the PCM RF switch is situated over the substrate, and the substrate is a heat spreader for the PCM RF switch. An integrated passive device (IPD) is disposed in an interlayer dielectric above the PCM RF switch, and is a metal resistor, a metal-oxide-metal (MOM) capacitor, and/or an inductor. In another approach, the PCM RF switch is disposed in an interlayer dielectric above the IPD, and the IPD is a poly resistor and/or a capacitor.

20 Claims, 14 Drawing Sheets

Related U.S. Application Data application No. 16/114,106, filed on Aug. 27, 2018, and a continuation-in-part of application No. 16/103,587, filed on Aug. 14, 2018, now Pat. No. 10,461,253, and a continuation-in-part of application No. 16/103,490, filed on Aug. 14, 2018, now Pat. No. 10,476,001, and a continuation-in-part of application No. 16/103,646, filed on Aug. 14, 2018, now Pat. No. 10,475,993.

(51) Int. Cl.
*H01L 23/522* (2006.01)
*H01L 23/525* (2006.01)
*H01L 23/66* (2006.01)
*H01L 23/00* (2006.01)

(52) U.S. Cl.
CPC ...... *H01L 23/5227* (2013.01); *H01L 23/5228* (2013.01); *H01L 23/5256* (2013.01); *H01L 23/66* (2013.01); *H01L 24/13* (2013.01); *H01L 45/126* (2013.01); *H01L 45/1226* (2013.01); *H01L 45/1286* (2013.01); *H01L 45/143* (2013.01); *H01L 45/144* (2013.01); *H01L 2223/6616* (2013.01); *H01L 2223/6627* (2013.01); *H01L 2223/6672* (2013.01); *H01L 2224/13025* (2013.01)

(56) References Cited

U.S. PATENT DOCUMENTS

| | | | |
|---|---|---|---|
| 7,522,029 B1 | 4/2009 | Lantz | |
| 8,314,983 B2 | 11/2012 | Frank | |
| 9,257,647 B2 | 2/2016 | Borodulin | |
| 9,362,492 B2 | 6/2016 | Goktepeli | |
| 9,368,720 B1* | 6/2016 | Moon | H01L 45/1286 |
| 9,444,430 B1 | 9/2016 | Abdo | |
| 9,601,545 B1* | 3/2017 | Tu | H01L 27/0805 |
| 9,640,759 B1 | 5/2017 | Curioni | |
| 9,891,112 B1 | 2/2018 | Abel | |
| 9,917,104 B1 | 3/2018 | Roizin | |
| 10,128,243 B2 | 11/2018 | Yoo | |
| 10,164,608 B2* | 12/2018 | Belot | H01L 45/1206 |
| 10,529,922 B1* | 1/2020 | Howard | H01L 45/1286 |
| 2005/0127348 A1 | 6/2005 | Horak | |
| 2006/0246712 A1 | 11/2006 | Kim | |
| 2007/0075347 A1 | 4/2007 | Lai | |
| 2008/0142775 A1 | 6/2008 | Chen | |
| 2010/0084626 A1 | 4/2010 | Delhougne | |
| 2010/0238720 A1 | 9/2010 | Tio Castro | |
| 2011/0291784 A1 | 12/2011 | Nakatsuji | |
| 2013/0187120 A1 | 7/2013 | Redaelli | |
| 2013/0285000 A1 | 10/2013 | Arai | |
| 2014/0191181 A1* | 7/2014 | Moon | H01L 27/2409 257/4 |
| 2014/0264230 A1 | 9/2014 | Borodulin | |
| 2014/0339610 A1 | 11/2014 | Rashed | |
| 2015/0048424 A1 | 2/2015 | Tien | |
| 2015/0090949 A1 | 4/2015 | Chang | |
| 2015/0333131 A1 | 11/2015 | Mojumder | |
| 2016/0035973 A1 | 2/2016 | Raieszadeh | |
| 2016/0071653 A1 | 3/2016 | Lamorey | |
| 2016/0308507 A1 | 10/2016 | Engelen | |
| 2017/0092694 A1 | 3/2017 | Brightsky | |
| 2017/0126205 A1 | 5/2017 | Lin | |
| 2017/0187347 A1 | 6/2017 | Rinaldi | |
| 2017/0243861 A1 | 8/2017 | Wang | |
| 2017/0365427 A1 | 12/2017 | Borodulin | |
| 2018/0005786 A1 | 1/2018 | Navarro | |
| 2018/0194615 A1 | 7/2018 | Nawaz | |
| 2018/0269393 A1 | 9/2018 | Zhang | |
| 2019/0064555 A1 | 2/2019 | Hosseini | |
| 2019/0067572 A1 | 2/2019 | Tsai | |
| 2019/0172657 A1 | 6/2019 | Zhu | |
| 2019/0267214 A1 | 8/2019 | Liu | |

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS)*, Monterey, CA, 2013, pp. 1-4.

* cited by examiner

SEMICONDUCTOR DEVICES HAVING PHASE-CHANGE MATERIAL (PCM) RADIO FREQUENCY (RF) SWITCHES AND INTEGRATED PASSIVE DEVICES

CLAIMS OF PRIORITY

The present application is a continuation-in-part of and claims the benefit of and priority to application Ser. No. 16/103,490 filed on Aug. 14, 2018, titled. "Manufacturing RF Switch Based on Phase-Change Material,". The present application is also a continuation-in-part of and claims the benefit of and priority to application Ser. No. 16/103,587 filed on Aug. 14, 2018, titled "Design for High Reliability RF Switch Based on Phase-Change Material,". The present application is also a continuation-in-part of and claims the benefit of and priority to application Ser. No. 16/103,646 filed on Aug. 14, 2018, titled "PCM RF Switch Fabrication with Subtractively Formed Heater,". The present application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element,". The present application is also a continuation-in-part of and claims the benefit of and priority to application Ser. No. 16/161,960 filed on Oct. 16, 2018, titled "Phase-Change Material (PCM) Radio Frequency (RF) Switch with Reduced Parasitic Capacitance,". The disclosures and contents of all of the above-identified applications are hereby incorporated fully by reference into the present application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous phase, phase-change materials may need to achieve temperatures of approximately seven hundred degrees Celsius (700° C.) or more, and may need to cool down within hundreds of nanoseconds.

In order to rapidly cool down phase-change materials, heat must be dissipated from a PCM RF switch by using heat spreading techniques. However, heat spreading techniques may pose device design challenges for integrating passive devices. Conventional fabrication techniques for integrating passive devices may not be easily compatible with PCM RF switches. Various modifications in structure have significant impact on thermal energy management that decrease the reliability of PCM RF switches. Accordingly, integrating PCM RF switches with passive devices in the same semiconductor device can present significant challenges. Specialty manufacturing is often impractical, and large scale manufacturing generally trades practicality for the ability to control device characteristics.

Thus, there is a need in the art for semiconductor devices integrating both PCM RF switches and IPDs.

SUMMARY

The present disclosure is directed to semiconductor devices having phase-change material (PCM) radio frequency (RF) switches and integrated passive devices, substantially as shown in and/or described in connection with at least one of the figures, and as set forth in the claims.

DETAILED DESCRIPTION

Figure 1:
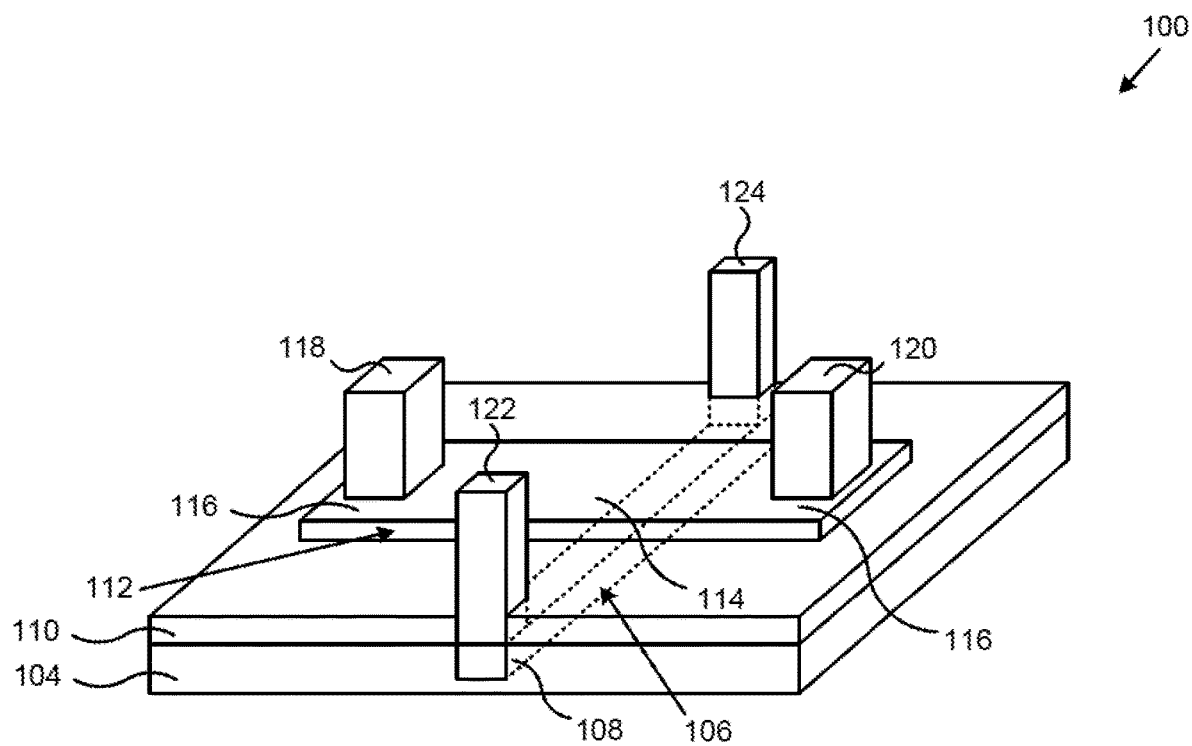
FIG. 1 illustrates a perspective view of a portion of a phase-change material (PCM) radio frequency (RF) switch according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a perspective view of a portion of a phase-change material (PCM) radio frequency (RF) switch according to one implementation of the present application. As shown in FIG. 1, PCM RF switch 100 includes lower dielectric 104, heating element 106 having terminal segments 108, thermally conductive and electrically insulating material 110, PCM 112 having active segment 114 and passive segments 116, PCM contacts 118 and 120, and heater contacts 122 and 124. For purposes of illustration, the perspective view in FIG. 1 shows selected structures of PCM RF switch 100. PCM RF switch 100 may include other structures not shown in FIG. 1.

Lower dielectric 104 in PCM RF switch 100 is situated below thermally conductive and electrically insulating material 110. As shown in FIG. 1, lower dielectric 104 is also adjacent to sides of heating element 106. Lower dielectric 104 extends along the width of PCM RF switch 100, and is also coplanar with the top of heating element 106. Because PCM RF switch 100 includes lower dielectric 104 on the sides of heating element 106, less heat transfers horizontally (i.e., from the sides) and more heat dissipates vertically, from heating element 106 toward active segment 114 of PCM 112. In various implementations, lower dielectric 104 can have a relative width and/or a relative thickness greater or less than shown in FIG. 1. Lower dielectric 104 can comprise any material with thermal conductivity lower than that of thermally conductive and electrically insulating material 110. In various implementations, lower dielectric 104 can comprise silicon oxide ($Si_XO_Y$), ($Si_XN_Y$), or another dielectric.

Heating element 106 in PCM RF switch 100 is situated in lower dielectric 104. Heating element 106 also underlies active segment 114 of PCM 112. Heating element 106 generates a crystallizing heat pulse or an amorphizing heat pulse for transforming active segment 114 of PCM 112. Heating element 106 can comprise any material capable of Joule heating. Heating element 106 can be connected to electrodes of a pulse generator (not shown in FIG. 1) that generates crystallizing or amorphizing voltage or current pulses. Preferably, heating element 106 comprises a material that exhibits minimal or substantially no electromigration, thermal stress migration, and/or agglomeration. In various implementations, heating element 106 can comprise tungsten (W), molybdenum (Mo), titanium (Ti), titanium tungsten (TiW), titanium nitride (TiN), tantalum (Ta), nickel chromium (NiCr), or nickel chromium silicon (NiCrSi). For example, in one implementation, heating element 106 comprises tungsten lined with titanium and titanium nitride.

Thermally conductive and electrically insulating material 110 in PCM RF switch 100 is situated on top of heating element 106 and lower dielectric 104, and under PCM 112 and, in particular, under active segment 114 of PCM 112. Thermally conductive and electrically insulating material 110 ensures efficient heat transfer from heating element 106 toward active segment 114 of PCM 112, while electrically insulating heating element 106 from PCM contacts 118 and 120, PCM 112, and other neighboring structures.

Thermally conductive and electrically insulating material 110 can comprise any material with high thermal conductivity and high electrical resistivity. In various implementations, thermally conductive and electrically insulating material 110 can comprise silicon carbide ($Si_XC_Y$), aluminum nitride ($Al_XN_Y$), aluminum oxide ($Al_XO_Y$), beryllium oxide ($Be_XO_Y$), diamond, or diamond-like carbon. In one implementation, thermally conductive and electrically insulating material 110 can be a nugget that does not extend along the width of PCM RF switch 100. For example, thermally conductive and electrically insulating material 110 can be a nugget approximately aligned with heating element 106.

PCM 112 in PCM RF switch 100 is situated on top of thermally conductive and electrically insulating material 110. PCM 112 includes active segment 114 and passive segments 116. Active segment 114 of PCM 112 approximately overlies heating element 106 and is approximately defined by heating element 106. Passive segments 116 of PCM 112 extend outward and are transverse to heating element 106, and are situated approximately under PCM contacts 118 and 120. As used herein, "active segment" refers to a segment of PCM that transforms between crystalline and amorphous phases, for example, in response to a crystallizing or an amorphizing heat pulse generated by heating element 106, whereas "passive segment" refers to a segment of PCM that does not make such transformation and maintains a crystalline phase (i.e., maintains a conductive state).

With proper heat pulses and heat dissipation, active segment 114 of PCM 112 can transform between crystalline and amorphous phases, allowing PCM RF switch 100 to switch between ON and OFF states respectively. Active segment 114 of PCM 112 must be heated and rapidly quenched in order for PCM RF switch 100 to switch states. If active segment 114 of PCM 112 does not quench rapidly enough, it will not transform and PCM RF switch 100 will fail to switch states. How rapidly active segment 114 of PCM 112 must be quenched depends on the material, volume, and temperature of PCM 112. In one implementation, the quench time window can be approximately one hundred nanoseconds (100 ns) or greater or less.

PCM 112 can comprise germanium telluride ($Ge_XTe_Y$), germanium antimony telluride ($Ge_XSb_YTe_Z$), germanium selenide ($Ge_XSe_Y$), or any other chalcogenide. In various implementations, PCM 112 can be germanium telluride having from forty percent to sixty percent germanium by composition (i.e., $Ge_XTe_Y$, where $0.4 \leq X \leq 0.6$ and $Y=1-X$). The material for PCM 112 can be chosen based upon ON state resistivity, OFF state electric field breakdown voltage, crystallization temperature, melting temperature, or other considerations. It is noted that in FIG. 1, heating element 106 extends outwards and is transverse to PCM 112. Heating element 106 is illustrated with dashed lines as seen through various structures of PCM RF switch 100. Current flowing in heating element 106 flows substantially under active segment 114 of PCM 112.

PCM contacts 118 and 120 in PCM RF switch 100 are connected to passive segments 116 of PCM 112. Similarly, heater contacts 122 and 124 are connected to terminal segments 108 of heating element 106. PCM contacts 118 and 120 provide RF signals to and from PCM 112. Heater contacts 122 and 124 provide power to heating element 106 for generating a crystallizing heat pulse or an amorphizing heat pulse. PCM contacts 118 and 120 and heater contacts 122 and 124 can extend through various interlayer metal levels (not shown in FIG. 1). In various implementations, PCM contacts 118 and 120 and heater contacts 122 and 124 can comprise tungsten (W), copper (Cu), or aluminum (Al).

Figure 2:
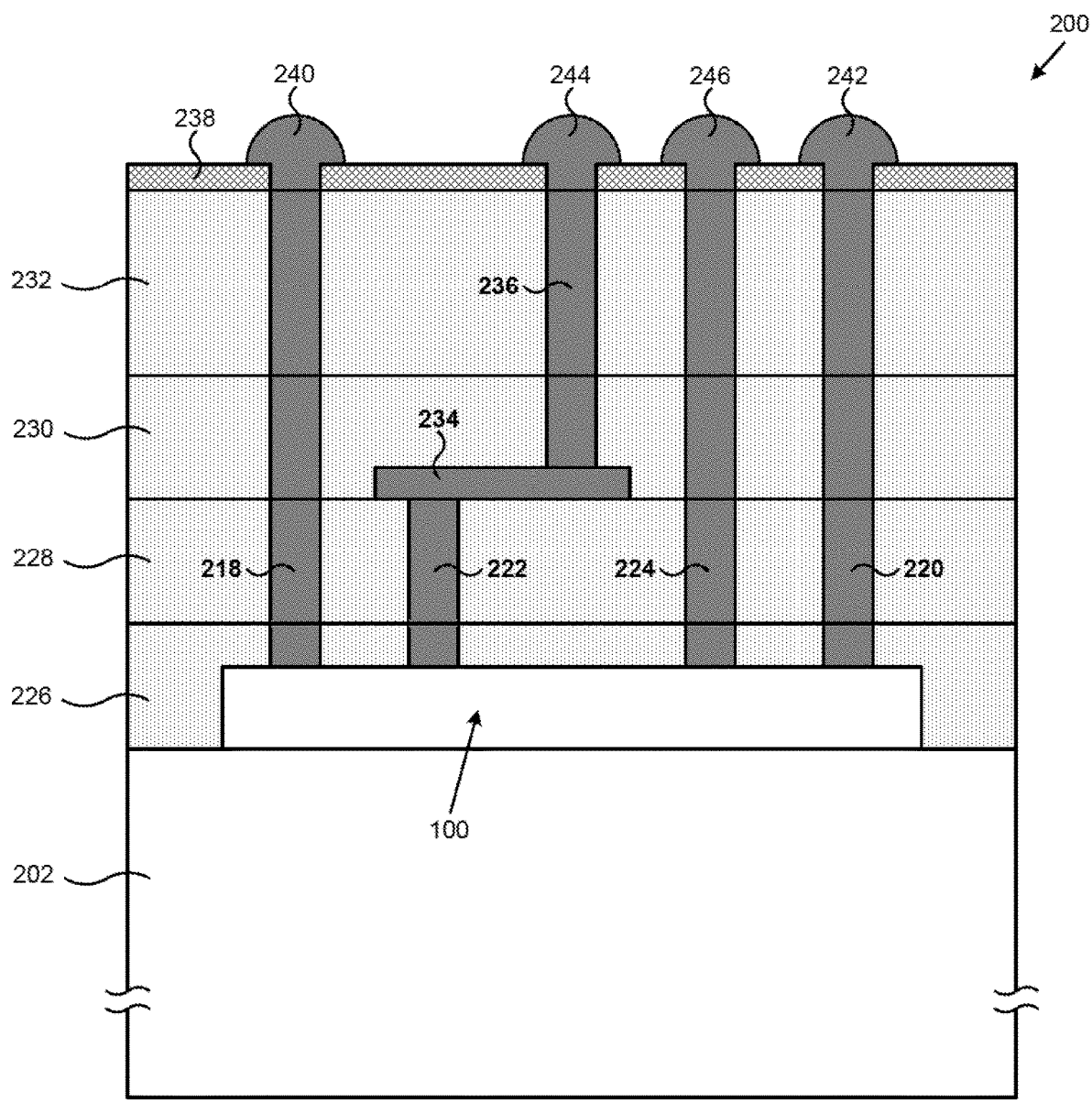
FIG. 2 illustrates a portion of an exemplary semiconductor device according to one implementation of the present application.

FIG. 2 illustrates a portion of an exemplary semiconductor device according to one implementation of the present application. Semiconductor device 200 includes PCM RF switch 100, substrate 202, interlayer metal levels 226 and 230, interlayer dielectrics 228 and 232, vias 218, 220, 222, 224, and 236, metal resistor 234, passivation 238, and micro bumps 240 242, 244, and 246. PCM RF switch 100 in FIG. 2 generally corresponds to PCM RF switch 100 in FIG. 1, and may have any implementations and advantages described above. However, PCM RF switch 100 is shown with less detail in FIG. 2 to preserve conciseness.

Substrate 202 is situated under PCM RF switch 100. In semiconductor device 200, substrate 202 performs as a heat spreader for PCM RF switch 100. In various implementations, substrate 202 can comprise silicon (Si), germanium (Ge), silicon germanium ($Si_XGe_Y$), silicon carbide ($Si_XC_Y$), group III-V, sapphire, or any bulk substrate material with high thermal conductivity. Substrate 202 dissipates excess heat generated by heating element 106 (shown in FIG. 1) of PCM RF switch 100 after a heat pulse, such as a crystallizing heat pulse or an amorphizing heat pulse, has transformed the state of PCM RF switch 100 to an ON state or an OFF state. In one implementation, in order for substrate 202 to effectively dissipate heat generated by heating element 106 (shown in FIG. 1), the thickness of lower dielectric 104 (shown in FIG. 1) beneath heating element 106 can be less than or approximately two thousand angstroms (2000 Å).

Interlayer metal level 226, interlayer dielectric 228, interlayer metal level 230, and interlayer dielectric 232 are sequentially situated over substrate 202. Interlayer metal level 226 typically comprises a pre-metal dielectric that is not shown in FIG. 2. The pre-metal dielectric would surround the top and the sides of PCM RF switch 100, and metal level one would be built over the pre-metal dielectric. However, for ease of illustration, FIG. 2 broadly shows interlayer metal level 226 which includes a pre-metal dielectric (not shown) over which metal level one is fabricated. Interlayer metal level 230 provides a layer in which passive devices, such as metal resistor 234, can be built. Interlayer metal level 230 is, for example, a second interlayer metal level and metal resistor 234 is formed in this level. Interlayer dielectric 228 provides insulation between interlayer metal levels 226 and 230. Interlayer dielectric 232 provides insulation for interlayer metal level 230. Interlayer dielectrics 228 and 232 also provide layers in which via segments can be built. In various implementations, semiconductor device 200 in FIG. 2 can include more interlayer metal levels and/or more interlayer dielectrics than those shown in FIG. 1.

Metal resistor 234 is an integrated passive device (IPD) and, in the present example, is disposed in interlayer metal level 230. In various implementations, metal resistor 234 can be disposed in any level above interlayer metal level 226 and PCM RF switch 100. In the present implementation, metal resistor 234 is electrically connected to heater contact 122 (shown in FIG. 1) by via 222. In other implementations, metal resistor 234 can be connected to heater contact 124 or PCM contacts 118 or 120 or any other active or passive device or a circuit in semiconductor device 200. In one implementation, metal resistor 234 can comprise any low-temperature interlayer metal. In various implementations, metal resistor 234 can comprise titanium nitride (TiN), tantalum nitride (TaN), or nickel chromium (NiCr).

Vias 218, 220, 222, 224, and 236 provide for electrical connections to PCM RF switch 100 and/or metal resistor 234. Specifically, via 218 electrically connects PCM contact 118 (shown in FIG. 1) of PCM RF switch 100 to Micro bump 240. Via 220 electrically connects PCM contact 120 (shown in FIG. 1) of PCM RF switch 100 to micro bump 242. Via 222 electrically connects heater contact 122 (shown in FIG. 1) of PCM RF switch 100 to one terminal of metal resistor 234. Via 236 electrically connects another terminal of metal resistor to micro bump 244. Via 224 electrically connects heater contact 124 (shown in FIG. 1) of PCM RF switch 100 to micro bump 246.

It is noted that in the present application, multiple vias and metal segments connected as a unit are referred to as a "via" for ease of reference. For example, in FIG. 2, via 218 includes a first metal segment in interlayer metal level 226 and a first via in interlayer dielectric 228, and includes a second metal segment in interlayer metal level 230 and a second via in interlayer dielectric 232. Metal segments are typically wider than vias and include overplots; however, for ease of illustration and for focus on the present inventive concepts the metal segments and vias are shown as one continuous "via" 218 in semiconductor device 200, and a similar representation may apply to other drawings in the present application.

Also, it is noted that the actual relative position of vias 218, 220, 222, and 224 may be different from the exemplary cross-sectional view shown in FIG. 2. For example, via 222 in FIG. 2 (connected to heater contact 122 in FIG. 1) may be situated on a different plane relative to vias 218 and 220 (connected to PCM contacts 118 and 120 in FIG. 1 respectively), and via 224 in FIG. 2 (connected to heater contact 124 in FIG. 1) may be situated on yet a different plane relative to vias 218 and 220. In other words, vias 218 and 220 may be situated in different planes and crosswise to vias 222 and 224.

Passivation 238 covers semiconductor device 200. In various implementations, passivation 238 can comprise silicon oxide ($Si_XO_Y$), ($Si_XN_Y$), or another dielectric. Passivation 238 includes windows therein for connecting micro bumps 240, 242, 244, and 246 to vias 218, 220, 236, and 224 respectively.

Micro bumps 240, 242, 244, and 246 provide external connections for semiconductor device 200. For example, micro bump 240 can provide an RF input terminal of semiconductor device 200. Micro bump 242 can provide an RF output terminal of semiconductor device 200. Micro bump 244 can provide a heater input terminal of semiconductor device 200. And micro bump 246 can provide a heater output terminal of semiconductor device 200. In various implementations, micro bumps 240, 242, 244, and 246 can comprise tin (Sn), copper (Cu), silver (Ag), or gold (Au). For example, micro bumps 240, 242, 244, and 246 can be an alloy of tin, copper, and silver ($Sn_XCu_YAg_Z$).

In semiconductor device 200, metal resistor 234 is situated over interlayer dielectric 228, which is situated above PCM RF switch 100. In order for PCM RF switch 100 to maintain active segments 114 and passive segments 116 (shown in FIG. 1) and operate properly, PCM RF switch 100 cannot be exposed to extremely high temperatures during processing of semiconductor device 200. When metal resistor 234 is formed above PCM RF switch 100, relatively low-temperature processes and low-temperature compatible materials can be used. Accordingly, metal resistor 234 may be a relatively low-precision resistor. In particular, the resistivity of metal resistor 234 may vary with temperature. Semiconductor device 200 must be carefully designed such that heat from PCM RF switch 100 does not significantly vary the resistivity of metal resistor 234. It is noted that semiconductor device 200 requires allocation of a portion of the surface area of substrate 202 for heat spreading, which might reduce the total surface area available for other devices. However, semiconductor device 200 is able to provide several advantages.

Because substrate 202 has high thermal conductivity, it effectively dissipates heat generated by heating element 106. For example, substrate 202 in FIG. 2 can be monocrystalline silicon (Si), and its thermal conductivity can be approximately one hundred seventy watts per meter-kelvin (170 W/(m·K)). Thus, active segment 114 of PCM 112 (shown in FIG. 1) can rapidly quench and successfully transform phases, and PCM RF switch 100 can switch states with improved reliability.

Substrate 202 in FIG. 2 also has a large mass, which dissipates heat efficiently. Additionally, because substrate 202 is situated on the bottom of semiconductor device 200, when semiconductor device 200 is mounted on a printed circuit board (PCB) (not shown in FIG. 2), substrate 202 can further dissipate heat utilizing the PCB.

The quicker cooling of PCM RF switch 100 allows PCM 112 to utilize different materials and different dimensions that require faster quench times. The quicker cooling of PCM RF switch 100 also allows more area of PCM 112 to be transformed, creating a wider active segment 114. A wider active segment 114 improves RF performance of PCM RF switch 100 by increasing its breakdown voltage and linearity.

Figure 3:
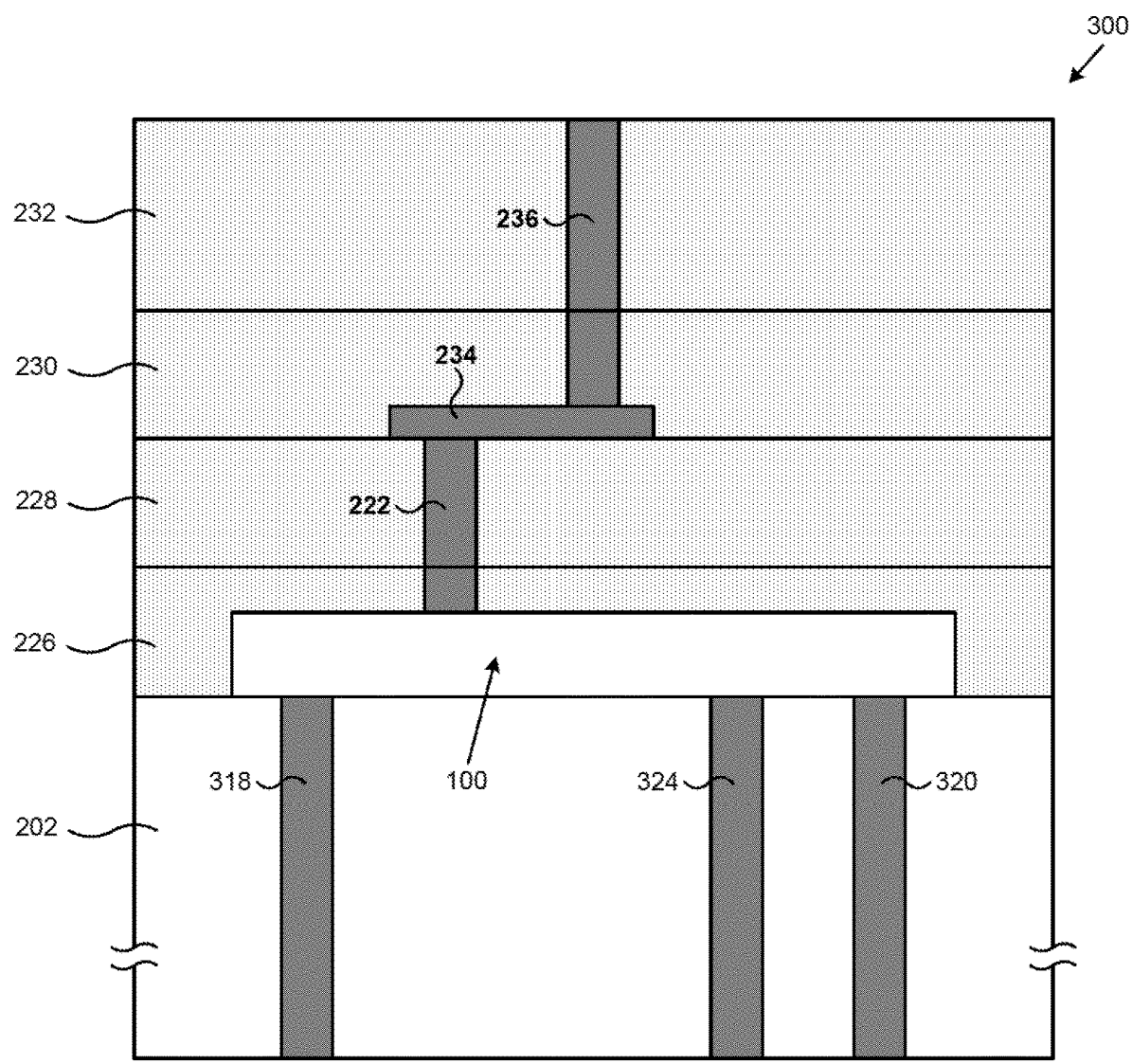
FIG. 3 illustrates a portion of an exemplary semiconductor device according to one implementation of the present application.

FIG. 3 illustrates a portion of an exemplary semiconductor device according to one implementation of the present application. Semiconductor device 300 in FIG. 3 is similar to semiconductor device 200 in FIG. 2, except for differences described below. Semiconductor device 300 in FIG. 3 does not include vias 218, 220, and 224. Instead, through-substrate-vias (TSVs) 318, 320, and 324 provide for electrical connections to PCM RF switch 100. Specifically, TSV 318 electrically connects to PCM contact 118 (shown in FIG. 1) of PCM RF switch 100. TSV 320 electrically connects to PCM contact 120 (shown in FIG. 1) of PCM RF switch 100. TSV 324 electrically connects to heater contact 124 (shown in FIG. 1) of PCM RF switch 100. Although not shown in FIG. 3, it is understood that passivation can cover the bottom and/or top of semiconductor device 300, and that micro bumps can be connected to via 236 and/or TSVs 318, 320, and 324.

TSVs 318, 320, and 324 in semiconductor device 300 increase its versatility. For example, because PCM contacts 118 and 120 and heater contact 124 (shown in FIG. 1) of PCM RF switch 100 are not electrically connected to IPDs disposed in interlayer metal level 230 above PCM RF switch 100, vias such as vias 218, 220, and 224 in FIG. 2 are not needed. Rather, PCM contacts 118 and 120 and heater contact 124 are connected to TSV 318, 320, and 324 disposed below PCM RF switch 100 and extending through substrate 202. As a result, more area is available in interlayer metal levels 226 and 230 for other IPDs, and more area is available at the top of semiconductor device 300 for external connections. In various implementations, more or fewer TSVs can be connected to PCM RF switch 100.

Figure 4:
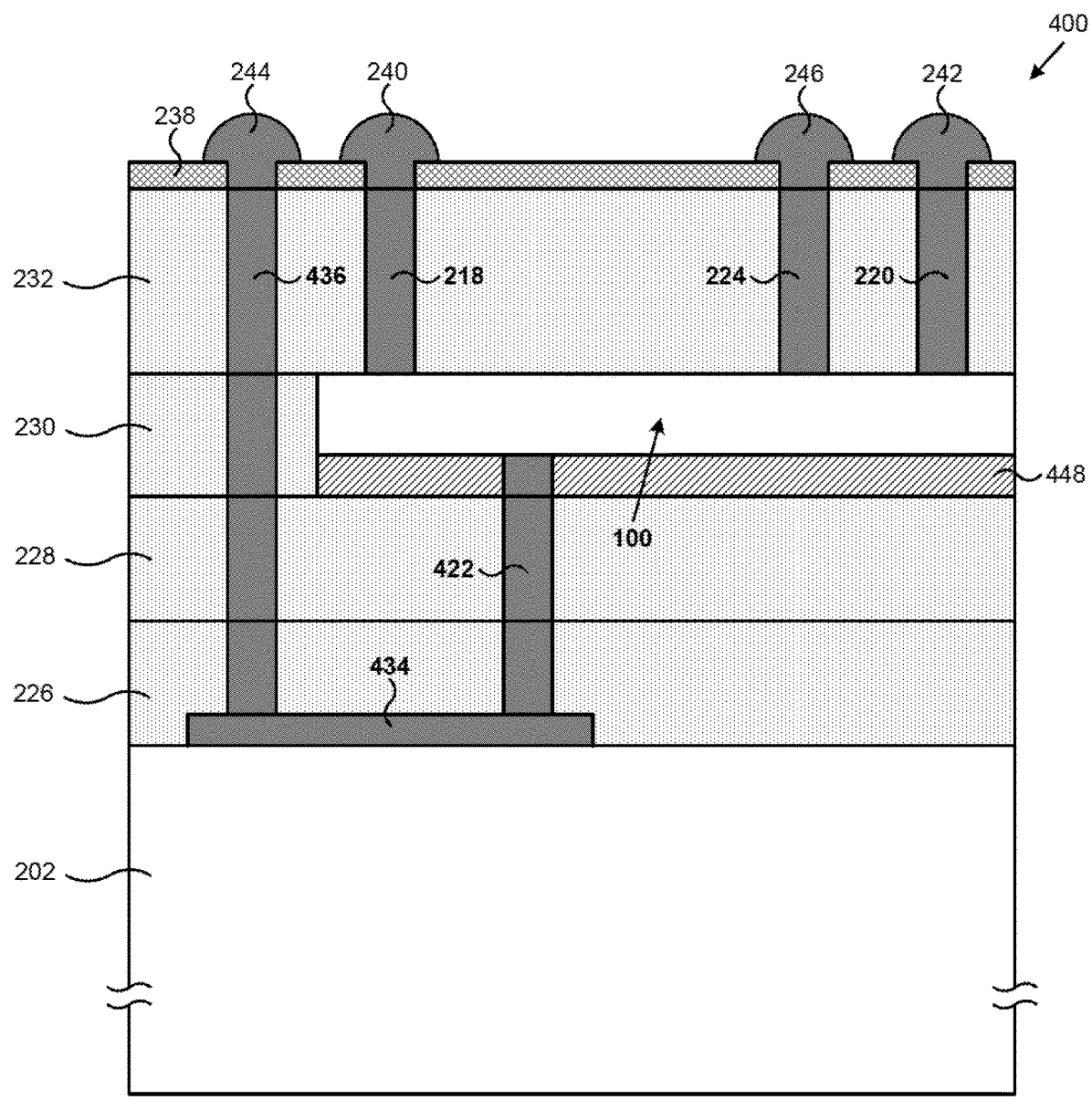
FIG. 4 illustrates a portion of an exemplary semiconductor device according to one implementation of the present application.

FIG. 4 illustrates a portion of an exemplary semiconductor device according to one implementation of the present application. Semiconductor device 400 in FIG. 4 is similar to semiconductor device 200 in FIG. 2, except for differences described below. In semiconductor device 400 in FIG. 4, poly resistor 434 is disposed on substrate 202, and PCM RF switch 100 is disposed above poly resistor 434 in interlayer metal level 230. Heat spreader 448 is also situated under PCM RF switch 100 in interlayer metal level 230. Via 422 electrically connects heater contact 122 (shown in FIG. 1) of PCM RF switch 100 to one terminal of poly resistor 434. Notably, in the implementation of FIG. 4, via 422 connects from the bottom of PCM RF switch 100. In this implementation, heater contact 122 (shown in FIG. 1) would extend downward through lower dielectric 104 (shown in FIG. 1), rather than upward through thermally conductive and electrically insulating material 110 (shown in FIG. 1). Via 436 electrically connects another terminal of poly resistor 434 to micro bump 244.

Heat spreader 448 is situated under PCM RF switch 100 in interlayer metal level 230. Heat spreader 448 dissipates excess heat generated by heating element 106 (shown in FIG. 1) of PCM RF switch 100 after a heat pulse, such as a crystallizing heat pulse or an amorphizing heat pulse, has transformed the state of PCM RF switch 100 to an ON state or an OFF state. Heat spreader 448 can comprise any material with high thermal conductivity. Preferably, heat spreader 448 also comprises a material with high electrical resistivity. In various implementations, heat spreader 448 can comprise silicon carbide ($Si_XC_Y$), aluminum nitride ($Al_XN_Y$), aluminum oxide ($Al_XO_Y$), beryllium oxide ($Be_XO_Y$), diamond, or diamond-like carbon. In one implementation, the thermal conductivity of heat spreader 448 can range from approximately thirty five watts per meter-kelvin to approximately one hundred twenty watts per meter-kelvin (35 W/(m·K)-120 W/(m·K)). In one implementation, the electrical resistivity of heat spreader 448 can be approximately one trillion ohm-meters or greater (>1E12 Ω·m). Although heat spreader 448 in FIG. 4 is illustrated as coextensive with PCM RF switch 100, in other implementations, heat spreader 448 can have any other shape or pattern. For example, heat spreader 448 can extend along the length of semiconductor device 400.

As shown in FIG. 4, poly resistor 434 is an example of an IPD and is disposed over substrate 202. In various implementations, poly resistor 434 can be disposed in any level below interlayer metal level 230 and PCM RF switch 100. In the present implementation, poly resistor 434 is electrically connected to heater contact 122 (shown in FIG. 1) by via 422. In other implementations, poly resistor 434 can be connected to heater contact 124 or PCM contacts 118 or 120. Poly resistor 434 can comprise polycrystalline silicon and can be fabricated in a manner known in the art.

In semiconductor device 400, PCM RF switch 100 is situated over interlayer dielectric 228, which is situated above poly resistor 434. Because PCM RF switch 100 is not situated over substrate 202, substrate 202 does not perform as a heat spreader. A dedicated heat spreader 448 must be used to rapidly quench and successfully transform phases of active segment 114 of PCM 112 (shown in FIG. 1). Heat spreader 448 in FIG. 4 is generally less effective at transferring heat compared to substrate 202 in FIG. 2. In particular, heat generally transfers faster in monocrystalline materials than in amorphous materials. For example, heat spreader 448 in FIG. 4 can be amorphous $Al_XN_Y$, and its thermal conductivity can range from approximately thirty five watts per meter-kelvin to approximately fifty watts per meter-kelvin (35 W/(m·K)-120 W/(m·K)). In contrast, in one implementation, substrate 202 in FIG. 2 can be monocrystalline Si, and its thermal conductivity can be approximately one hundred seventy watts per meter-kelvin (170 W/(m·K)). Heat spreader 448 in FIG. 4 also has a smaller mass, which dissipates heat less efficiently. Additionally, because heat spreader 448 in FIG. 4 is situated in interlayer metal level 230, heat spreader 448 cannot further dissipate heat utilizing a PCB. However, semiconductor device 400 is able to provide several advantages.

In semiconductor device 400, high-temperature processes and high-temperature compatible materials needed to form poly resistor 434 can be used. Because poly resistor 434 is formed prior to PCM RF switch 100, PCM RF switch 100 is not exposed to extremely high temperatures during processing of semiconductor device 400. Poly resistor 434 is generally a high-precision resistor. Moreover, the resistivity of poly resistor 434 in FIG. 4 is significantly greater than the resistivity of metal resistor 234 in FIG. 2, requiring less area to achieve the same resistance. The resistivity of poly resistor 434 in FIG. 4 also exhibits less variation with temperature compared to metal resistor 234 in FIG. 2. Semiconductor device 400 provides some design tolerance against heat from PCM RF switch 100 varying the resistance of poly resistor 434. Semiconductor device 400 may be suitable for applications where a high-precision resistance is needed. Semiconductor device 400 also does not require allocation of a portion of the surface area of substrate 202 for heat spreading, which increases the total surface area available for other devices.

Figure 5:
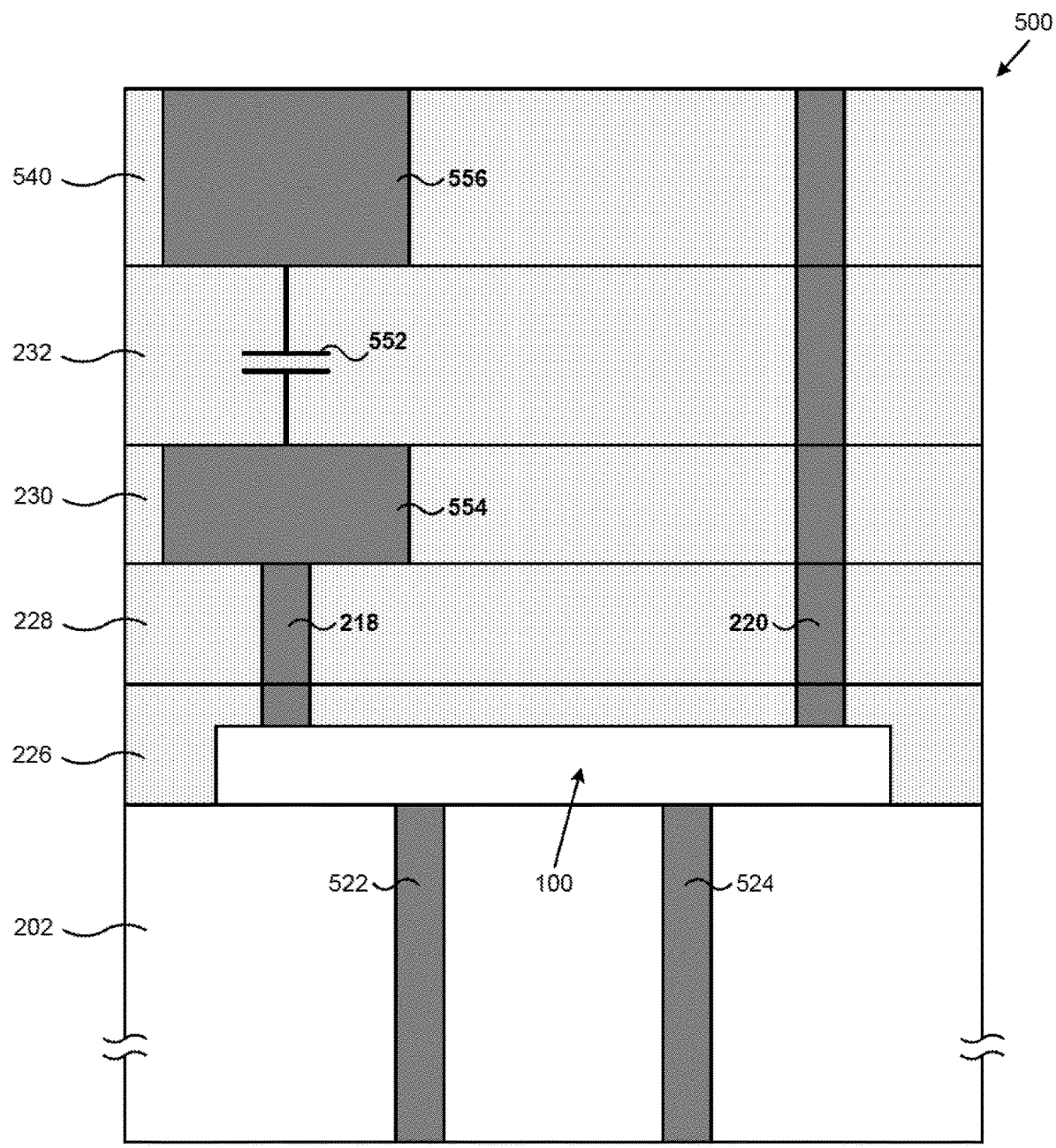
FIG. 5 illustrates a portion of an exemplary semiconductor device according to one implementation of the present application.

FIG. 5 illustrates a portion of an exemplary semiconductor device according to one implementation of the present application. Semiconductor device 500 in FIG. 5 is similar to semiconductor device 300 in FIG. 3, except for differences described below. In semiconductor device 500 in FIG. 5, vertical MOM capacitor 552 is an IPD, and a resistor, such as metal resistor 234 in FIG. 3 is not used. Interlayer metal level 540 is situated over interlayer dielectric 232. Vertical metal-oxide-metal (MOM) capacitor 552 is formed between bottom plate 554 in interlayer metal level 230 and top plate 556 in interlayer metal level 540.

Vertical MOM capacitor 552 capacitively couples top plate 556 to bottom plate 554, creating part of an RF signal path of PCM RF switch 100. In various implementations, vertical MOM capacitor 552 can be formed between any levels above interlayer metal level 226 and PCM RF switch 100. In the present implementation, vertical MOM capacitor 552 is electrically connected to PCM contact 118 (shown in FIG. 1) by via 218. In other implementations, vertical MOM capacitor 552 can be connected to any other structure in semiconductor device 500, such as PCM contact 120 (shown in FIG. 1). Top plate 556 and bottom plate 554 of vertical MOM capacitor 552 can comprise any low-temperature interlayer metal. In various implementations, top plate 556 and bottom plate 554 of vertical MOM capacitor 552 can comprise W, Al, and/or Cu.

In the present example, via 218 electrically connects PCM contact 118 (shown in FIG. 1) of PCM RF switch 100 to bottom plate 554 of vertical MOM capacitor 552. Via 220 electrically connects to PCM contacts 120 (shown in FIG. 1) of PCM RF switch 100. TSV 522 electrically connects to heater contact 122 (shown in FIG. 1) of PCM RF switch 100. TSV 524 electrically connects to heater contact 124 (shown in FIG. 1) of PCM RF switch 100. Although not shown in FIG. 5, it is understood that passivation can cover the bottom and/or top of semiconductor device 500, and that micro bumps can be connected to top plate 556 of vertical MOM capacitor 552, via 220, and/or TSVs 522 and 524. In various implementations, more or fewer TSVs can be connected to PCM RF switch 100.

Because vertical MOM capacitor 552 is formed between interlayer metal levels 230 and 540 and above interlayer metal level 226 and PCM RF switch 100, low-temperature processes and low-temperature compatible materials are generally used to form vertical MOM capacitor 552. However, because PCM RF switch 100 is situated over substrate 202, substrate 202 effectively dissipates heat generated by heating element 106 (shown in FIG. 1). Moreover, TSVs 522 and 524 disposed below PCM RF switch 100 and extending through substrate 202 create more area available in interlayer metal levels 226, 230, and 540 for other IPDs, increasing the versatility of semiconductor device 500.

Figure 6:
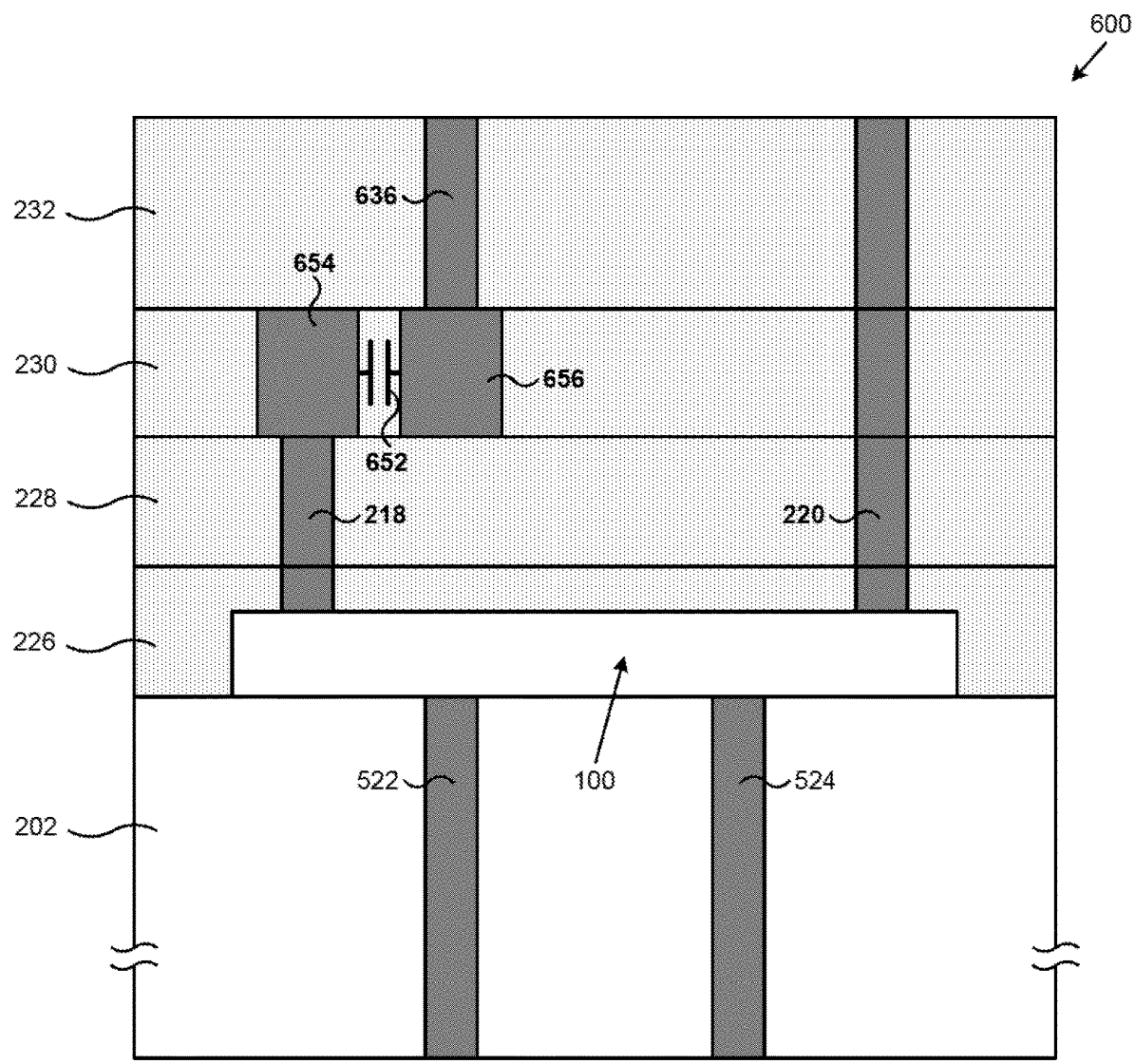
FIG. 6 illustrates a portion of an exemplary semiconductor device according to one implementation of the present application.

FIG. 6 illustrates a portion of an exemplary semiconductor device according to one implementation of the present application. Semiconductor device 600 in FIG. 6 is similar to semiconductor device 500 in FIG. 5, except for differences described below. In semiconductor device 600 in FIG. 6, interdigitated MOM capacitor 652 is an IPD, and a vertical MOM capacitor, such as vertical MOM capacitor 552 in FIG. 5, is not used. Interdigitated MOM capacitor 652 is formed between digits 654 and 656 in interlayer metal level 230.

Interdigitated MOM capacitor 652 capacitively couples digit 654 to digit 656, creating part of an RF signal path of PCM RF switch 100. In various implementations, interdigitated MOM capacitor 652 can be formed in any level above interlayer metal level 226 and PCM RF switch 100. In the present implementation, digit 654 of interdigitated MOM capacitor 652 is electrically connected to PCM contact 118 (shown in FIG. 1) by via 218. Via 636 is electrically connected to digit 656 of interdigitated MOM capacitor 652. In other implementations, interdigitated MOM capacitor 652 can be connected to any other structure in semiconductor device 600, such as PCM contact 120 (shown in FIG. 1). Digits 654 and 656 of interdigitated MOM capacitor 652 can comprise any low-temperature interlayer metal. In various implementations, digits 654 and 656 of interdigitated MOM capacitor 652 can comprise W, Al, and/or Cu. In various implementations, interdigitated MOM capacitor 652 can have more digits than shown in FIG. 6.

Because interdigitated MOM capacitor 652 is formed in interlayer metal level 230 and above interlayer metal level 226 and PCM RF switch 100, semiconductor device 600 in FIG. 6 may have any implementations and advantages described above with regard to semiconductor device 500 in FIG. 5. Additionally, because interdigitated MOM capacitor 652 is formed in a single interlayer metal level, rather than between two interlayer metal levels, interdigitated MOM capacitor 652 in FIG. 6 has a capacitance with improved density compared to vertical MOM capacitor 552 in FIG. 5.

Figure 7:
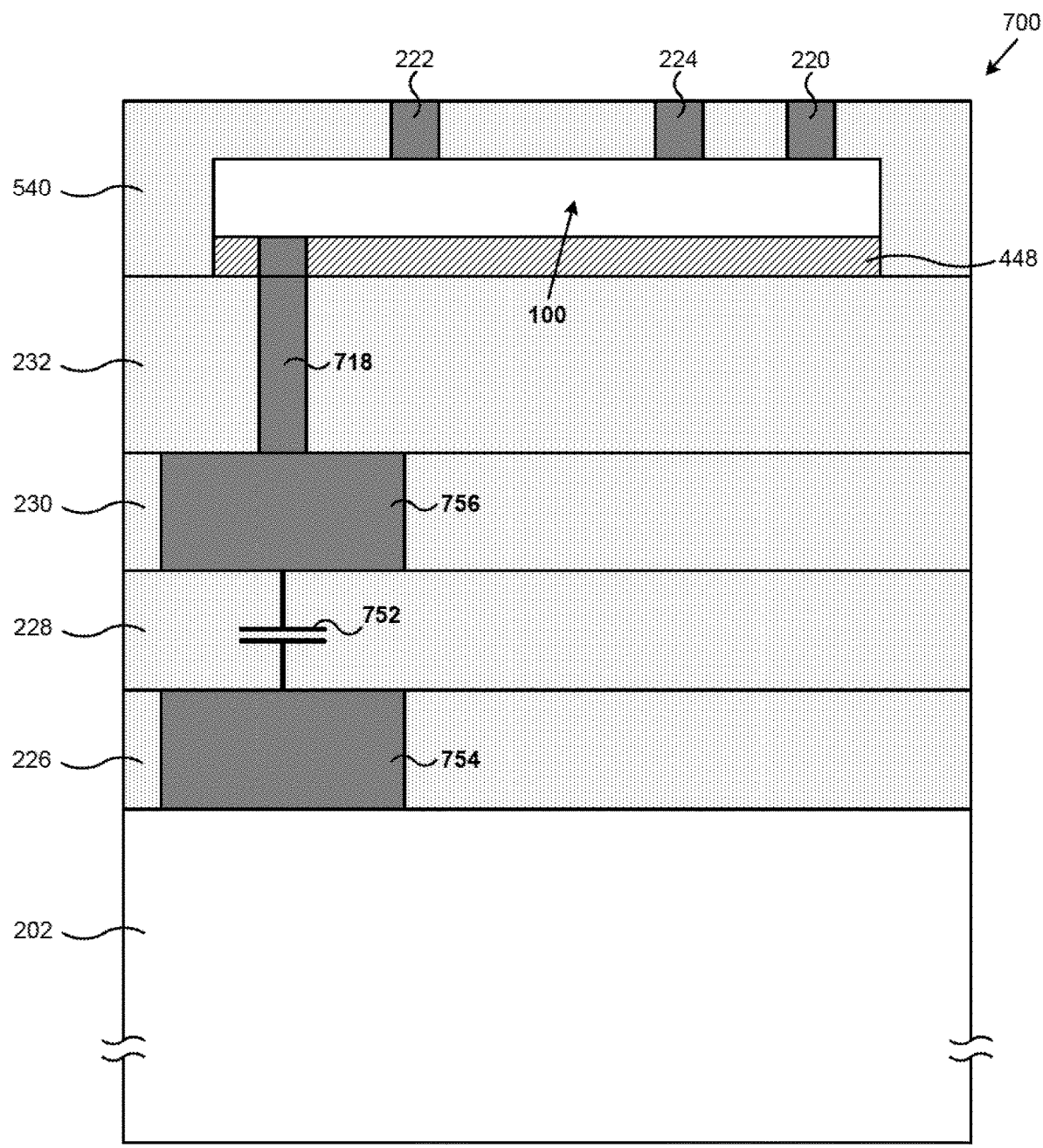
FIG. 7 illustrates a portion of an exemplary semiconductor device according to one implementation of the present application.

FIG. 7 illustrates a portion of an exemplary semiconductor device according to one implementation of the present application. Semiconductor device 700 in FIG. 7 is similar to semiconductor device 500 in FIG. 5, except for differences described below. In semiconductor device 700 in FIG. 7, PCM RF switch 100 is disposed in interlayer metal level 540 above vertical MOM capacitor 752. In various implementations, vertical PCM RF switch 100 can be disposed in any level above vertical MOM capacitor 752. Vertical MOM capacitor 752 is formed between bottom plate 754 and top plate 756. Bottom plate 754 of vertical MOM capacitor 752 is situated over substrate 202 in interlayer metal level 226. Top plate 756 of vertical MOM capacitor 752 is situated over interlayer dielectric 228 in interlayer metal level 230.

Via 718 electrically connects PCM contact 118 (shown in FIG. 1) of PCM RF switch 100 to top plate 756 of vertical MOM capacitor 752. Notably, in the implementation of FIG. 7, via 718 connects from the bottom of PCM RF switch 100. In this implementation, PCM contact 118 (shown in FIG. 1) would extend downward through lower dielectric 104 (shown in FIG. 1), rather than upward. In other implementations, vertical MOM capacitor 752 can be connected to any other structure in semiconductor device 700. In the present example, via 220 can be connected to PCM contact 120 (shown in FIG. 1), while vias 222 and 224 can be connected to heater contacts 122 and 124 (shown in FIG. 1).

Heat spreader 448 is also situated under PCM RF switch 100 in interlayer metal level 540. Heat spreader 448 in FIG. 7 generally corresponds to heat spreader 448 in FIG. 4, and may have any implementations and advantages described above. Because vertical MOM capacitor 752 is formed between interlayer metal levels 226 and 230 and below interlayer metal level 540 and PCM RF switch 100, high-temperature processes and low-temperature compatible materials can be used to form vertical MOM capacitor 752.

Because PCM RF switch 100 is not situated over substrate 202, substrate 202 does not perform as a heat spreader. A dedicated heat spreader 448 must be used to rapidly quench and successfully transform phases of active segment 114 of PCM 112 (shown in FIG. 1). Additionally, TSVs, such as TSVs 522 and 524 in FIG. 6, will not provide efficient connections to PCM RF switch 100. However, because vertical MOM capacitor 752 is formed prior to PCM RF switch 100, high-temperature processes can be used to process vertical MOM capacitor 752. Semiconductor device 700 also does not require allocation of a portion of the surface area of substrate 202 for heat spreading, which increases the total surface area available for other devices.

Figure 8:
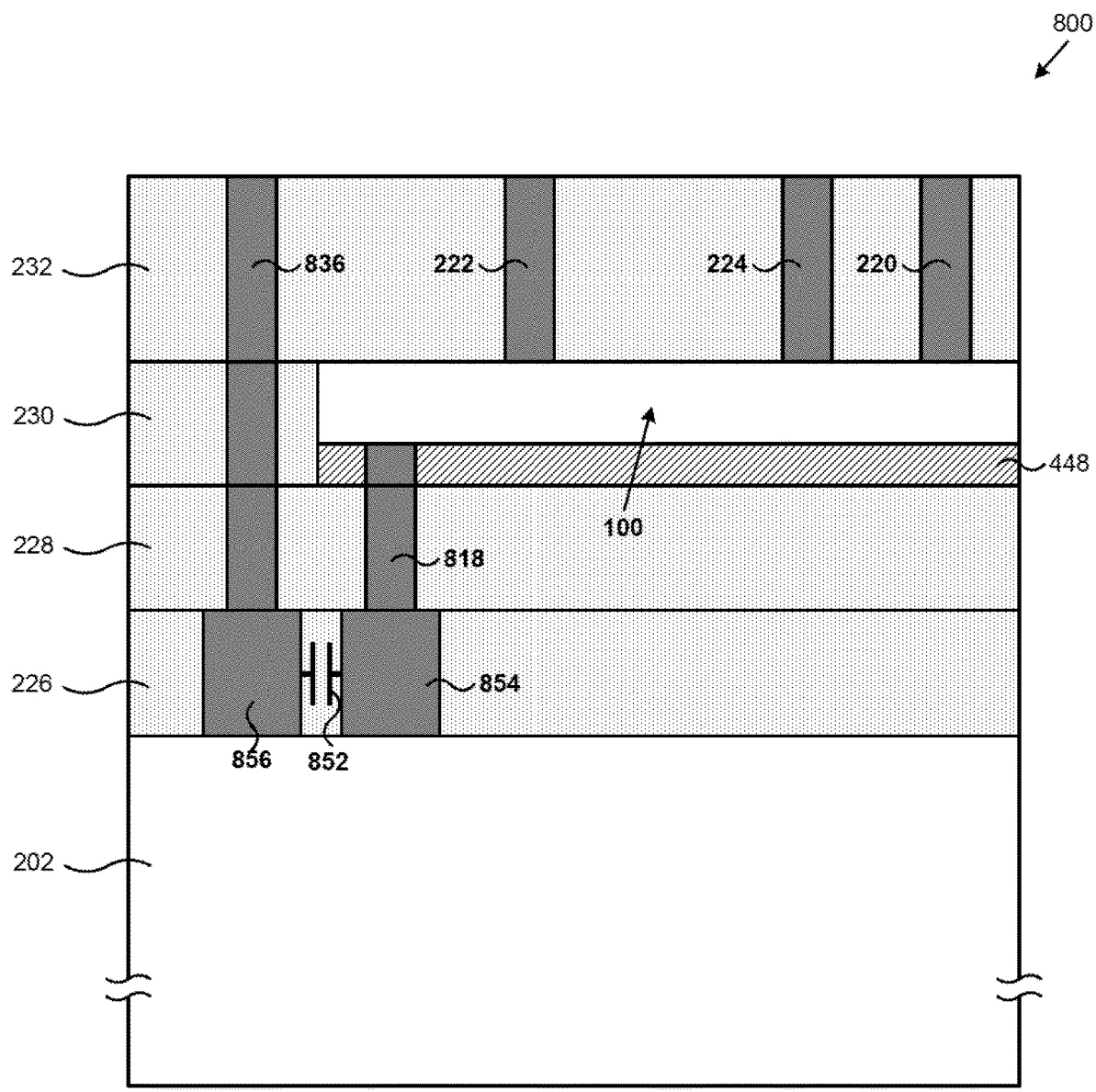
FIG. 8 illustrates a portion of an exemplary semiconductor device according to one implementation of the present application.

FIG. 8 illustrates a portion of an exemplary semiconductor device according to one implementation of the present application. Semiconductor device 800 in FIG. 8 is similar to semiconductor device 700 in FIG. 7, except for differences described below. In semiconductor device 800 in FIG. 8, interdigitated MOM capacitor 852 is an IPD, and a vertical MOM capacitor, such as vertical MOM capacitor 752, in FIG. 7 is not used. Interdigitated MOM capacitor 852 is formed between digits 854 and 856 in interlayer metal level 226.

Interdigitated MOM capacitor 852 capacitively couples digit 854 to digit 856, creating part of an RF signal path of PCM RF switch 100. In various implementations, interdigitated MOM capacitor 852 can be formed in any level below PCM RF switch 100. In the present implementation, digit 854 of interdigitated MOM capacitor 852 is electrically connected to PCM contact 118 (shown in FIG. 1) by via 818. Via 836 is electrically connected to digit 856 of interdigitated MOM capacitor 852. In other implementations, interdigitated MOM capacitor 852 can be connected to any other structure in semiconductor device 800, such as PCM contact 120 (shown in FIG. 1).

Because interdigitated MOM capacitor 852 is formed in interlayer metal level 226 and below PCM RF switch 100, semiconductor device 800 in FIG. 8 may have any implementations and advantages described above with regard to semiconductor device 700 in FIG. 7. Additionally, because interdigitated MOM capacitor 852 is formed in a single interlayer metal level, rather than between two interlayer metal levels, interdigitated MOM capacitor 852 in FIG. 8 has a capacitance with improved density compared to vertical MOM capacitor 762 in FIG. 7.

Figure 9:
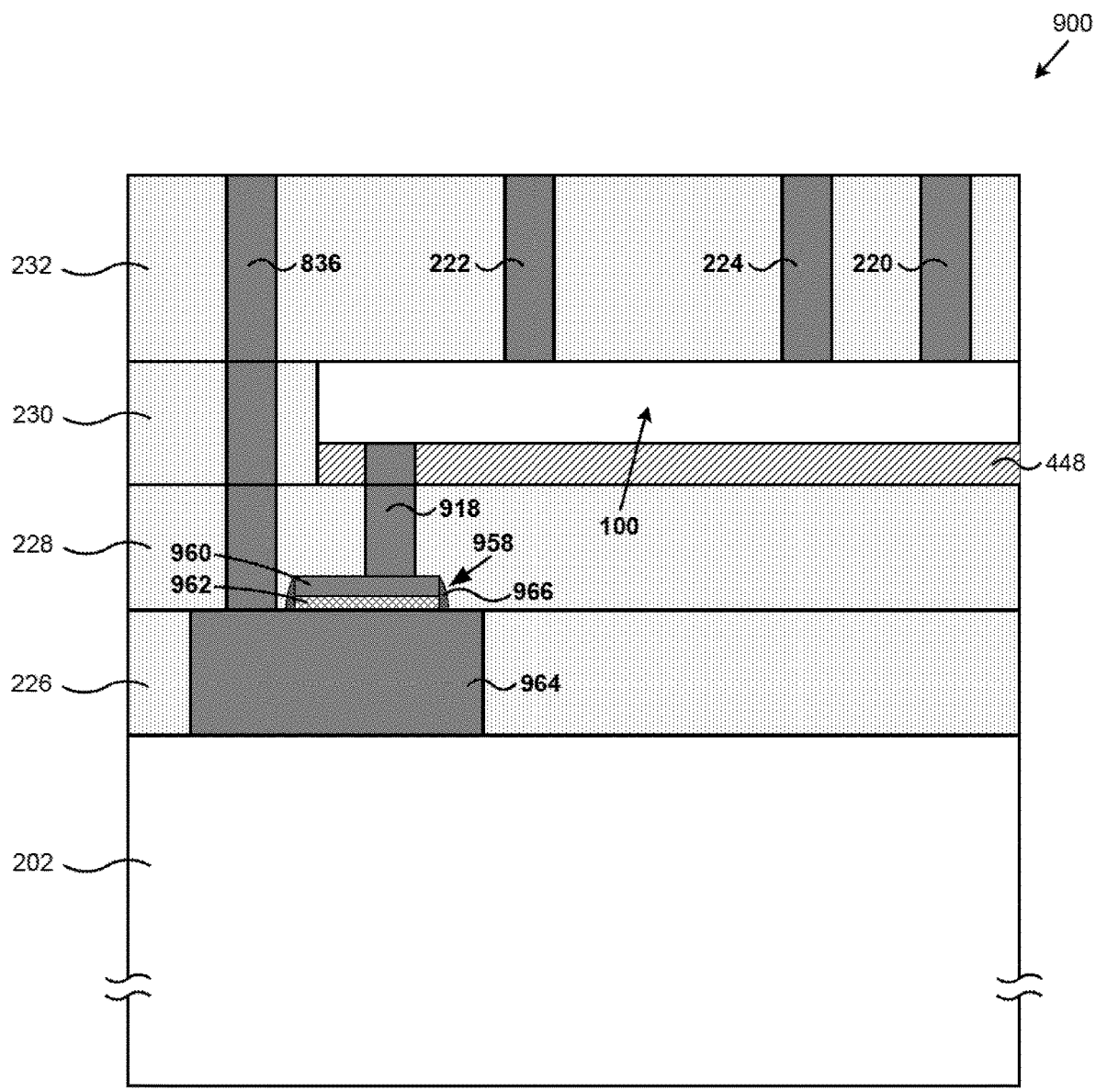
FIG. 9 illustrates a portion of an exemplary semiconductor device according to one implementation of the present application.

FIG. 9 illustrates a portion of an exemplary semiconductor device according to one implementation of the present application. Semiconductor device 900 in FIG. 9 is similar to semiconductor device 800 in FIG. 8, except for differences described below. In semiconductor device 900 in FIG. 9, metal-insulator-metal (MIM) capacitor 958 is an IPD, and an interdigitated MOM capacitor, such as interdigitated MOM capacitor 852 in FIG. 8 is not used.

In semiconductor device 900, thin high-k film 962 is situated on bottom capacitor plate 964. Bottom capacitor plate 964 is an interconnect metal in interlayer metal level 226. In various implementations, thin high-k film 962 comprises tantalum pentoxide, aluminum oxide, hafnium oxide, zirconium oxide, zirconium aluminum silicate, hafnium silicate, hafnium aluminum silicate, or other dielectrics with a relatively high dielectric constant. In one implementation, the thickness of thin high-k film 962 can range from approximately two hundred angstroms to approximately six hundred angstroms (200 Å-600 Å).

Top capacitor plate 960 is situated over thin high-k film 962. Top capacitor plate 960 can comprise, for example, titanium nitride, tantalum nitride, or a stack comprising aluminum and titanium nitride or tantalum nitride. In one implementation, the thickness of top capacitor plate 960 can range from approximately one thousand angstroms to approximately three thousand angstroms (1,000 Å-3,000 Å).

Top capacitor plate 960 can be provided, for example, by physical vapor deposition (PVD) or chemical vapor deposition (CVD) techniques. It is noted that, unlike top plate 756 of vertical MOM capacitor 752 in FIG. 7, top capacitor plate 960 of MIM capacitor 958 in FIG. 9 is not formed in an interlayer metal level, such as interlayer metal level 230. As used herein, "MIM capacitor" refers to a capacitor having a top capacitor plate formed within an interlayer dielectric where conventionally no metal exists, such as within interlayer dielectric 228.

Spacers 966 are situated adjacent to the sidewalls of thin high-k film 962 and top capacitor plate 960 of MIM capacitor 958. In various implementations, spacers 966 can comprise $Si_xN_y$, or another dielectric. Spacers 966 protect the sidewalls of thin high-k film 962 from aggressive etch chemistry used to etch metals during fabrication of semiconductor device 900. Thus, there is no increase in leakage current of MIM capacitor 958 or decrease in the breakdown voltage of MIM capacitors 958 due to an increase in defects or voids within thin high-k film 962. As such, the capacitance value of MIM capacitor 958 is more precisely controlled, and semiconductor device 900 is more reliable.

Via 918 electrically connects PCM contact 118 (shown in FIG. 1) of PCM RF switch 100 to top capacitor plate 960 of MIM capacitor 958. In various implementations, MIM capacitor 958 can be connected by more or fewer vias than shown in FIG. 9. Notably, because top capacitor plate 960 is within interlayer dielectric 228, via 918 only extends partially through interlayer dielectric 228.

MIM capacitor 958 formed by top capacitor plate 960, thin high-k film 962, and bottom capacitor plate 964 have a capacitance with significantly improved density. MIM capacitor 958 does not require the addition of interlayer metal levels. MIM capacitor 958 advantageously increases routing capability in semiconductor device 900 because MIM capacitor 958 utilizes the space amply available between interlayer metal levels 226 and 230 without taking up space within an interlayer metal level. Further, high-temperature processes and high-temperature compatible materials, such as low pressure CVD (LPCVD) silicon nitride ($Si_xN_y$) can be used to form thin high-k film 962, since PCM RF switch 100 is fabricated after fabrication of MIM capacitor 958.

It is noted that although the present application refers to and specifically illustrates MOM and MIM capacitors, these capacitors and their specific configurations are used only as illustrative examples and are by no means exhaustive examples of various configurations or various types of capacitors that can be used within the scope of the present inventive concepts. For example, in various implementations, an MIS (metal-insulator-semiconductor) capacitor may be used instead of or in addition to MOM and MIM capacitors discussed in the present application. Various implementations of MIS capacitors are known in the art, any of which can be used within the scope of the present inventive concepts.

Moreover, in addition to IPDs such as capacitors, inductors, and resistors, the present inventive concepts apply to other types of IPDs, such as fuses, various types of vias and interconnect line configurations including, for example, transmission lines that can be utilized in various applications, such as RF and optical applications as known in the art.

Figure 10:
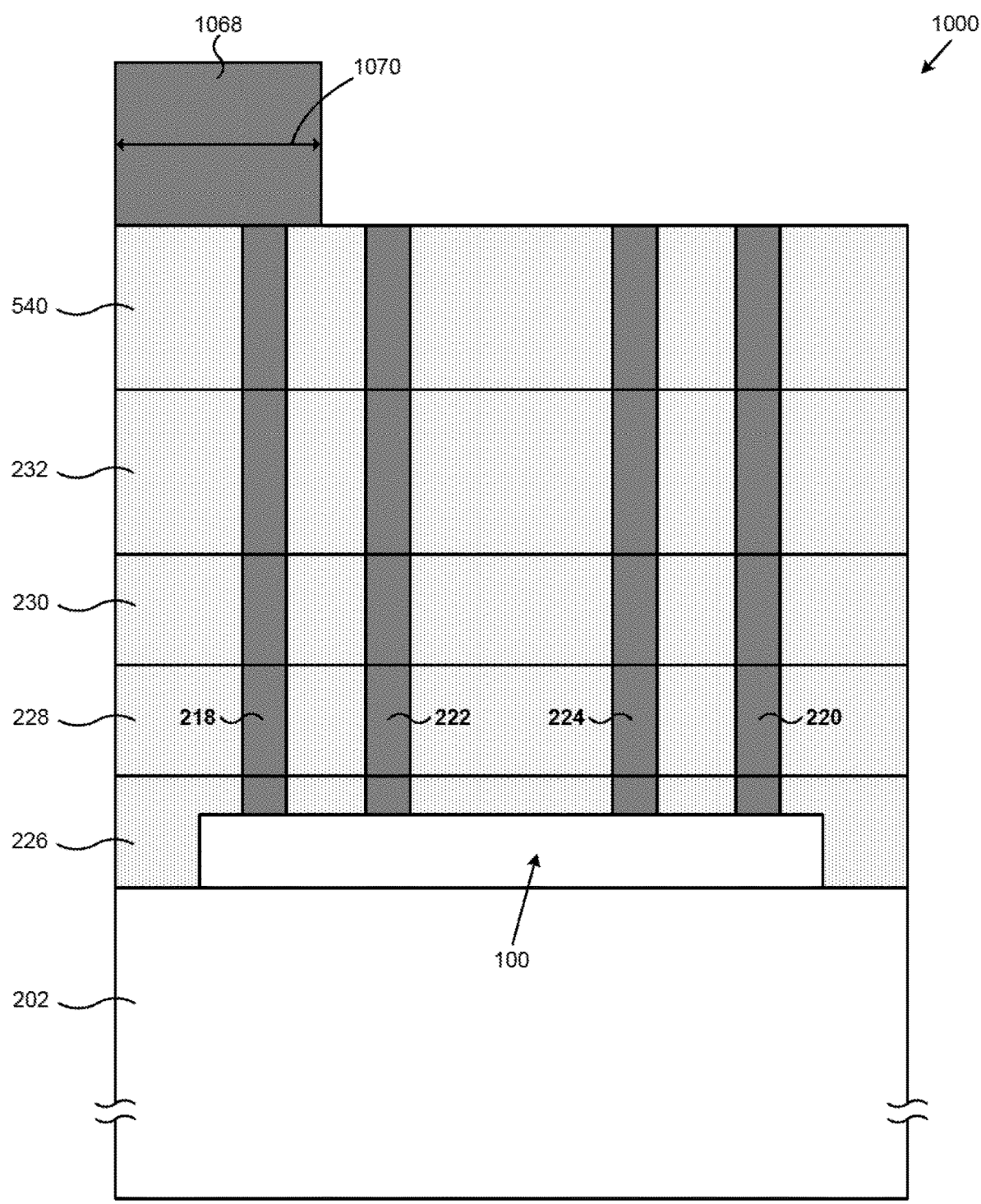
FIG. 10 illustrates a portion of an exemplary semiconductor device according to one implementation of the present application.

FIG. 10 illustrates a portion of an exemplary semiconductor device according to one implementation of the present application. Semiconductor device 1000 in FIG. 10 is similar to semiconductor device 500 in FIG. 5, except for differences described below. In semiconductor device 1000 in FIG. 10, subtractively etched inductor 1068 is an IPD, and a vertical MOM capacitor, such as vertical MOM capacitor 552, in FIG. 5, is not used.

In the present implementation, subtractively etched inductor 1068 is situated in specialized metal layer of semiconductor device 1000, such as a top redistribution layer. In various implementations, subtractively etched inductor 1068 can be situated in any level above PCM RF switch 100. Subtractively etched inductor 1068 can be formed, for example, by depositing an aluminum layer over semiconductor device 1000, and etching the aluminum layer to have a spiral pattern, as described below. In the present implementation, subtractively etched inductor 1068 is electrically connected to PCM contact 118 (shown in FIG. 1) by via 218. In other implementations, subtractively etched inductor 1068 can be connected to any other structure in semiconductor device 1000, such as PCM contact 120 (shown in FIG. 1).

Because PCM RF switch 100 is situated over substrate 202, substrate 202 effectively dissipates heat generated by heating element 106 (shown in FIG. 1). Additionally, because subtractively etched inductor 1068 is formed in, for example, a top redistribution layer, subtractively etched inductor 1068 can be relatively thick, such that it has a low resistance and a high quality factor.

Figure 11:
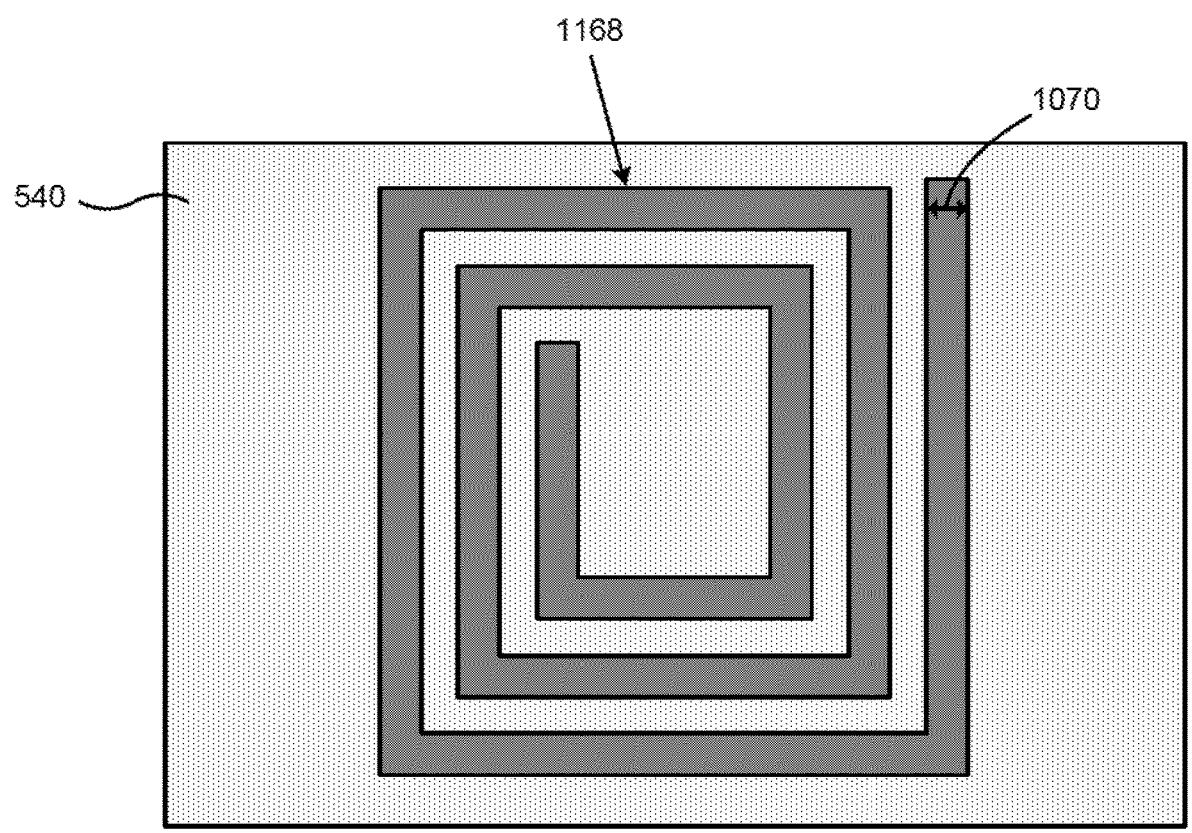
FIG. 11 illustrates a portion of an exemplary spiral inductor utilized in one implementation of the present application.

FIG. 11 illustrates a portion of an exemplary spiral inductor utilized in one implementation of the present application. FIG. 11 can represent a top view of a portion of semiconductor device 1000 in FIG. 10. Spiral inductor 1168 in FIG. 11 generally corresponds to subtractively etched inductor 1068 in FIG. 10. Likewise, width 1070 in FIG. 11 generally corresponds to width 1070 in FIG. 10. As shown in FIG. 11, spiral inductor 1168 is situated above interlayer metal level 540. As such, interlayer metal level 540 is seen as situated under spiral inductor 1168 in the top view of FIG. 11. In the implantation of FIG. 11, spiral inductor 1168 has a substantially square spiral pattern. In various implementations, spiral inductor 1168 may have any other patterns, such as a substantially circular spiral pattern, a substantially hexagonal spiral pattern, etc.

Figure 12:
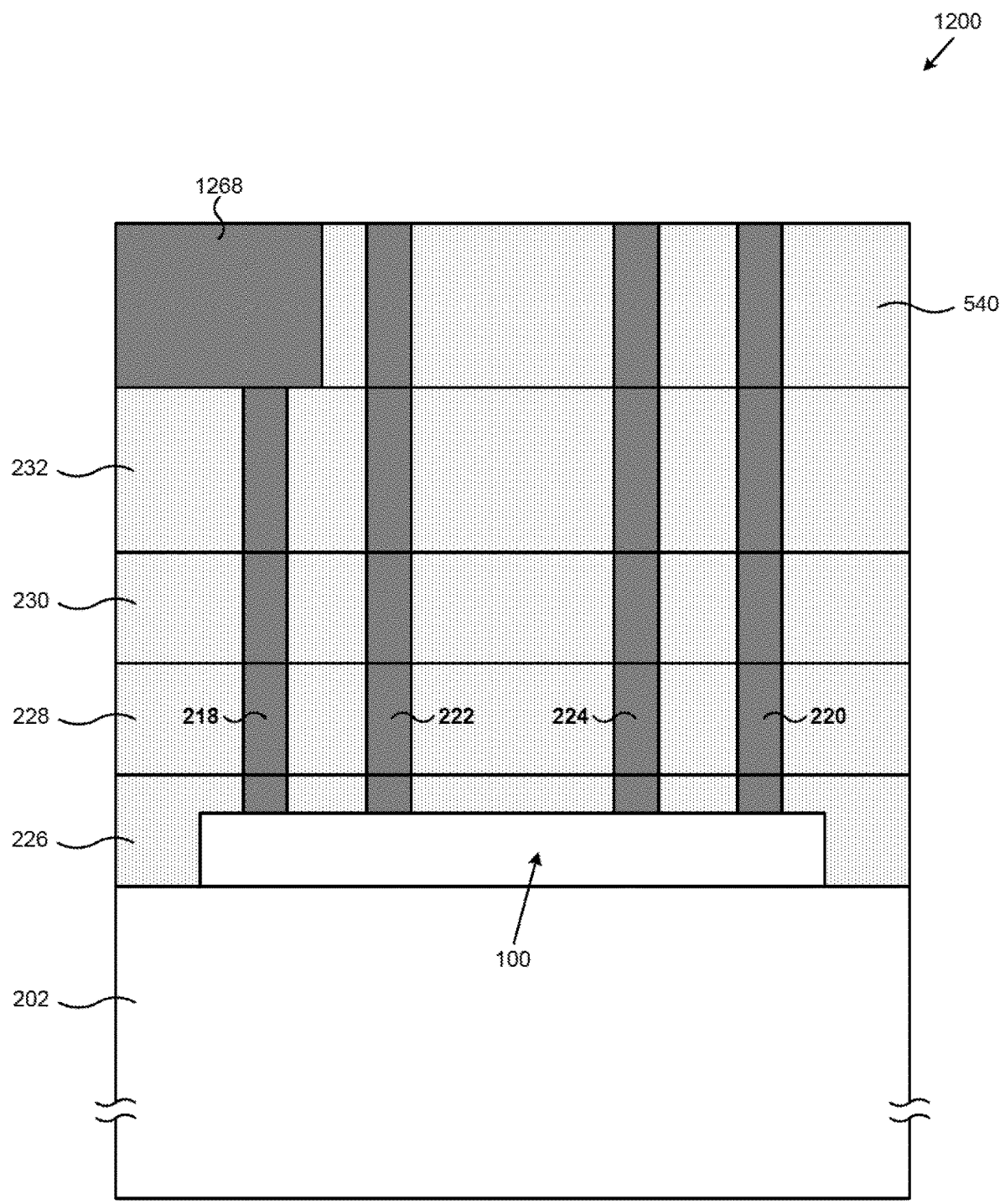
FIG. 12 illustrates a portion of an exemplary semiconductor device according to one implementation of the present application.

FIG. 12 illustrates a portion of an exemplary semiconductor device according to one implementation of the present application. Semiconductor device 1200 in FIG. 12 is similar to semiconductor device 1000 in FIG. 10, except for differences described below. In semiconductor device 1200 in FIG. 12, damascene inductor 1268 is an IPD, and a subtractively etched inductor, such as subtractively etched inductor 1068 in FIG. 10 is not used.

In the present implementation, damascene inductor 1268 is situated in a top metal level of semiconductor device 1200. In various implementations, damascene inductor 1268 can be situated in any level above PCM RF switch 100. Damascene inductor 1268 can be formed, for example, by etching a spiral-patterned trench in a dielectric and then filling the spiral-patterned trench with a metal such as copper. In the present implementation, damascene inductor 1268 is electrically connected to PCM contact 118 (shown in FIG. 1) of PCM RF switch 100 by via 218. In other implementations, damascene inductor 1268 can be connected to any other structure in semiconductor device 1200, such as PCM contact 120 (shown in FIG. 1) of PCM RF switch 100.

Because damascene inductor 1268 is situated in a top metal level and above PCM RF switch 100, semiconductor device 1200 in FIG. 12 may have any implementations and advantages described above with regard to semiconductor device 1000 in FIG. 10. Additionally, because damascene inductor 1268 in FIG. 12 generally comprises copper, it generally has a lower resistance and a higher quality factor compared to subtractively etched inductor 1068 in FIG. 10.

Figure 13:
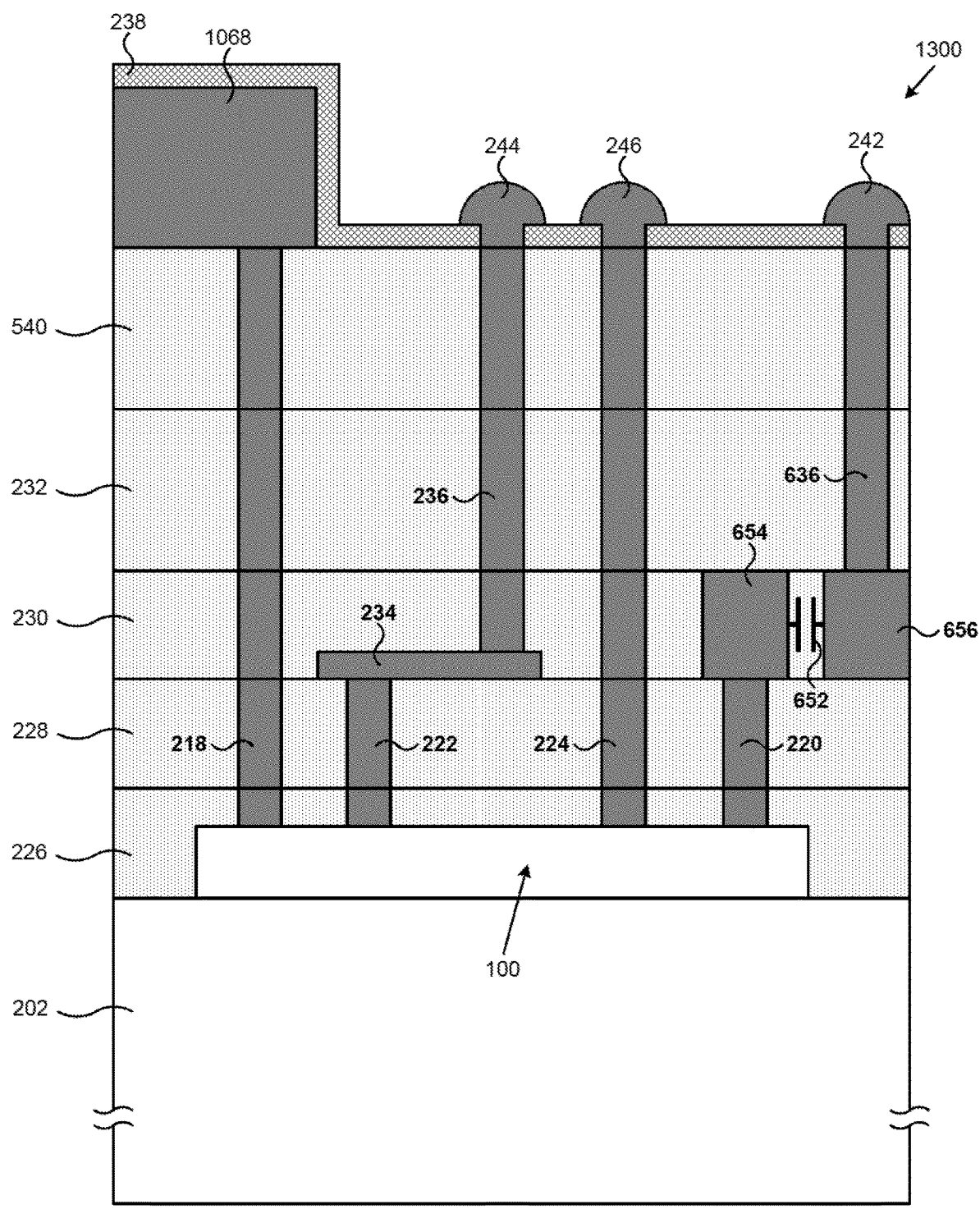
FIG. 13 illustrates a portion of an exemplary semiconductor device according to one implementation of the present application.

FIG. 13 illustrates a portion of an exemplary semiconductor device according to one implementation of the present application. Semiconductor device 1300 in FIG. 13 represents an implementation where multiple IPDs are disposed above PCM RF switch 100. In particular, semiconductor device 1300 includes metal resistor 234, interdigitated MOM capacitor 652, and subtractively etched inductor 1068.

Metal resistor 234 in FIG. 13 is similar to metal resistor 234 in FIG. 2. In the present example, metal resistor 234 in FIG. 13 is electrically connected to heater contact 122 (shown in FIG. 1) of PCM RF switch 100 by via 222. Metal resistor 234 is also electrically connected to micro bump 244 by via 236. Interdigitated MOM capacitor 652 in FIG. 13 is similar to interdigitated MOM capacitor 652 in FIG. 6, except that interdigitated MOM capacitor 652 in FIG. 13 is electrically connected to PCM contact 120 (shown in FIG. 1) of PCM RF switch 100 by via 220. Interdigitated MOM capacitor 652 is also electrically connected to micro bump 242 by via 636. In the present example, via 224 connects micro bump 246 to heater contact 124 (shown in FIG. 1) of PCM RF switch 100. Subtractively etched inductor 1068 in FIG. 13 is similar to subtractively etched inductor 1068 in FIG. 10. Subtractively etched inductor 1068 in FIG. 13 is electrically connected to PCM contact 118 (shown in FIG. 1) of PCM RF switch 100 by via 218.

Figure 14:
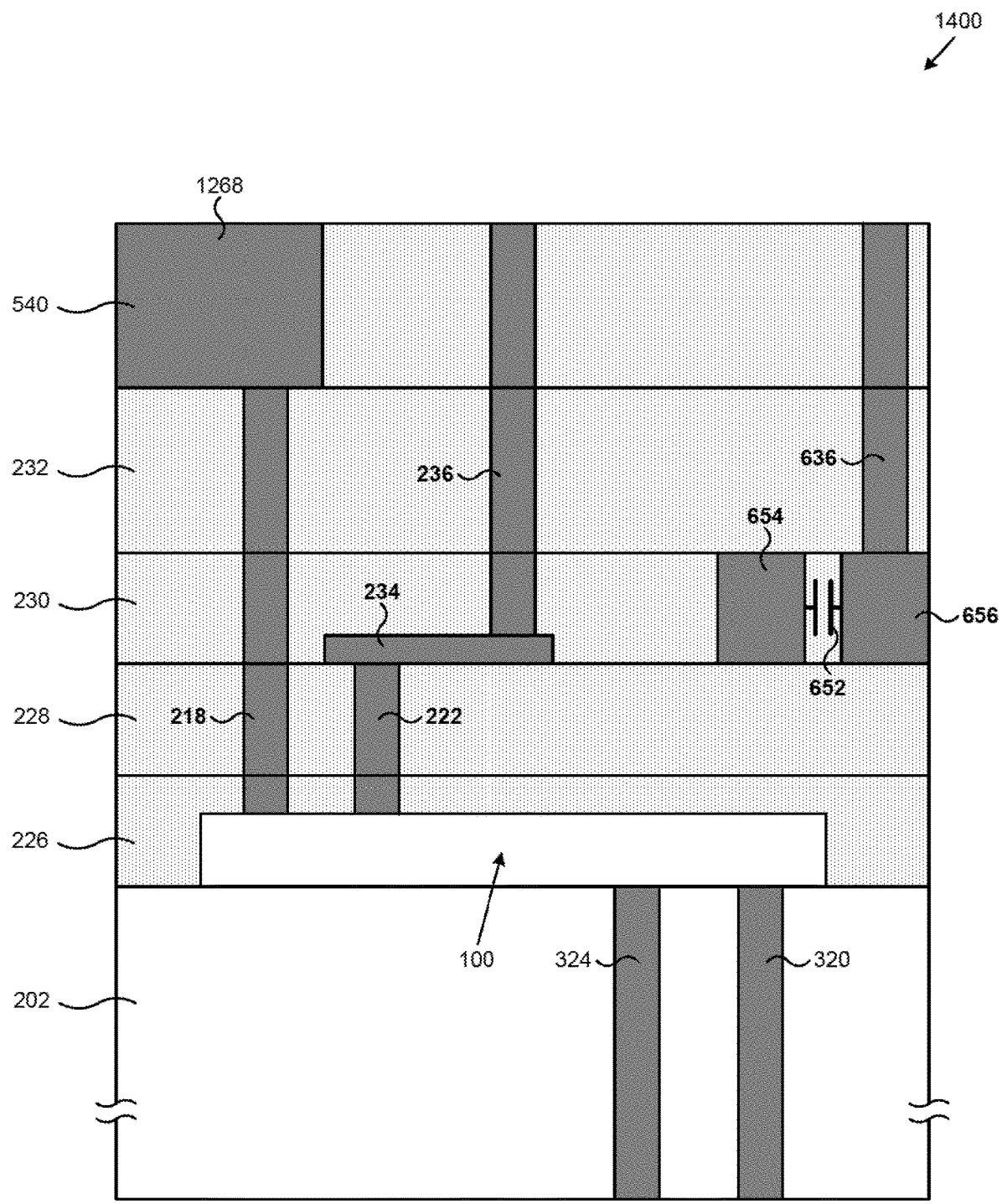
FIG. 14 illustrates a portion of an exemplary semiconductor device according to one implementation of the present application.

FIG. 14 illustrates a portion of an exemplary semiconductor device according to one implementation of the present application. Semiconductor device 1400 in FIG. 14 is similar to semiconductor device 1300 in FIG. 13, except for differences described below.

Semiconductor device 1400 in FIG. 14 does not include vias 220 and 224 of FIG. 13. Instead, in FIG. 14, TSVs 320 and 324 provide for electrical connections to PCM RF switch 100. Specifically, TSV 320 electrically connects to PCM contact 120 (shown in FIG. 1) of PCM RF switch 100. TSV 324 electrically connects to heater contact 124 (shown in FIG. 1) of PCM RF switch 100. Interdigitated MOM capacitor 652 in FIG. 14 is not electrically connected to PCM RF switch 100, and may be connected to other structures (not shown in FIG. 14). Semiconductor device 1400 in FIG. 14 does not include subtractively etched inductor 1068 of FIG. 13. Instead, semiconductor device 1400 in FIG. 14 includes damascene inductor 1268. Although not shown in FIG. 14, it is understood that passivation can cover the bottom and/or top of semiconductor device 1400, and that micro bumps can be connected to vias 236 and 636, and/or TSVs 320 and 324.

Thus, various implementations of the present application achieve semiconductor devices having IPDs and which utilize the inventive PCM RF switch of the present application to overcome the deficiencies in the art. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A semiconductor device including a substrate, said semiconductor device further comprising:
   a phase-change material (PCM) radio frequency (RF) switch comprising:
   a heating element;
   a PCM situated over said heating element;
   PCM contacts situated over passive segments of said PCM;
   said heating element extending transverse to said PCM and underlying an active segment of said PCM;
   said PCM RF switch being situated over said substrate and wherein said substrate is a heat spreader for said PCM RF switch;
   an integrated passive device (IPD) disposed in or over an interlayer dielectric, said interlayer dielectric being situated above said PCM RF switch in said semiconductor device;
   said IPD being selected from the group consisting of a metal resistor, a MOM capacitor, and an inductor.

2. The semiconductor device of claim 1, further comprising through-substrate-vias (TSVs).

3. The semiconductor device of claim 1, further comprising micro bumps.

4. The semiconductor device of claim 1, wherein said inductor is situated in a top metal level of said semiconductor device and wherein said inductor comprises a subtractively etched aluminum spiral inductor.

5. The semiconductor device of claim 1, wherein said inductor is situated in a top metal level of said semiconductor device and wherein said inductor comprises a damascene copper spiral inductor.

6. The semiconductor device of claim 1, wherein said MOM capacitor is an interdigitated MOM capacitor situated in a single metal level.

7. The semiconductor device of claim 1, wherein said MOM capacitor is a vertical MOM capacitor situated between two different metal levels.

8. A semiconductor device including a substrate, said semiconductor device further comprising:
   an integrated passive device (IPD) disposed over said substrate, said IPD being selected from the group consisting of a resistor and a capacitor;
   a phase-change material (PCM) radio frequency (RF) switch comprising:
   a heating element;
   a PCM situated over said heating element;
   PCM contacts situated over passive segments of said PCM;
   said heating element extending transverse to said PCM and underlying an active segment of said PCM;
   said PCM RF switch being disposed in or over an interlayer dielectric, said interlayer dielectric being situated above said IPD.

9. The semiconductor device of claim 8, further comprising a heat spreader situated under said PCM RF switch.

10. The semiconductor device of claim 8, further comprising micro bumps.

11. The semiconductor device of claim 8, said capacitor being selected from the group consisting of a MIM capacitor, a MOM capacitor, and a MIS capacitor.

12. The semiconductor device of claim 11, wherein said MIM capacitor is formed with a top capacitor plate and a thin high-k film below said top capacitor plate, wherein an interconnect metal is a bottom capacitor plate.

13. The semiconductor device of claim 11, wherein said MOM capacitor is an interdigitated MOM capacitor formed in a single metal level.

14. The semiconductor device of claim 11, wherein said MOM capacitor is a vertical MOM capacitor formed between two different metal levels.

15. A semiconductor device including a substrate, said semiconductor device further comprising:
   a metal resistor, a capacitor, and an inductor;
   a phase-change material (PCM) radio frequency (RF) switch comprising:
   a heating element;
   a PCM situated over said heating element;
   PCM contacts situated over passive segments of said PCM;
   said heating element extending transverse to said PCM and underlying an active segment of said PCM;
   said PCM RF switch being situated over said substrate and wherein said substrate is a heat spreader for said PCM RF switch;
   said metal resistor, said capacitor, or said inductor disposed in or over an interlayer dielectric, said interlayer dielectric being situated above said PCM RF switch in said semiconductor device.

16. The semiconductor device of claim 15, further comprising through-substrate-vias (TSVs).

17. The semiconductor device of claim 15, further comprising micro bumps.

18. The semiconductor device of claim 15, further comprising a fuse.

19. The semiconductor device of claim 15, further comprising a transmission line.

20. The semiconductor device of claim 15, wherein said capacitor is a MOM capacitor.

* * * * *

UNITED STATES PATENT AND TRADEMARK OFFICE
CERTIFICATE OF CORRECTION

| | | |
|---|---|---|
| PATENT NO. | : 10,686,128 B2 | Page 1 of 1 |
| APPLICATION NO. | : 16/274998 | |
| DATED | : June 16, 2020 | |
| INVENTOR(S) | : El-Hinnawy et al. | |

It is certified that error appears in the above-identified patent and that said Letters Patent is hereby corrected as shown below:

In the Claims

Column 16, Line 15, "thin high-k film" should be --high-k film--.

Signed and Sealed this
First Day of December, 2020

Andrei Iancu
*Director of the United States Patent and Trademark Office*